United States Patent
Majima (10) Patent No.: US 8,234,087 B2
(45) Date of Patent: Jul. 31, 2012

(54) APPARATUS AND METHOD FOR DETECTING A STATUS OF A SECONDARY BATTERY CONNECTED TO A LOAD

(75) Inventor: Yoshihide Majima, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 780 days.

(21) Appl. No.: 12/081,434

(22) Filed: Apr. 16, 2008

(65) Prior Publication Data

US 2009/0037124 A1    Feb. 5, 2009

(30) Foreign Application Priority Data

Jul. 30, 2007    (JP) ................. 2007-197862

(51) Int. Cl.
*G01R 31/36* (2006.01)
(52) U.S. Cl. ............ 702/63; 702/64; 702/117; 702/176; 702/182; 702/189
(58) Field of Classification Search .................. 702/63, 702/64, 117, 176, 182, 189; 324/426, 430, 324/431, 433; 320/132, 134, 137
See application file for complete search history.

(56) References Cited

U.S. PATENT DOCUMENTS

| | | | | |
|---|---|---|---|---|
| 5,315,228 A | * | 5/1994 | Hess et al. | ..... 320/106 |
| 5,830,595 A | * | 11/1998 | Song | ..... 429/92 |
| 5,955,869 A | * | 9/1999 | Rathmann | ..... 320/132 |
| 6,127,806 A | | 10/2000 | Tanjo et al. | |
| 6,495,989 B1 | | 12/2002 | Eguchi | |
| 6,789,026 B2 | | 9/2004 | Barsoukov et al. | |
| 6,832,171 B2 | | 12/2004 | Barsoukov et al. | |
| 6,892,148 B2 | | 5/2005 | Barsoukov et al. | |
| 7,208,914 B2 | * | 4/2007 | Klang | ..... 320/132 |

FOREIGN PATENT DOCUMENTS

| | | |
|---|---|---|
| JP | 7-244135 A | 9/1995 |
| JP | 11-326472 | 11/1999 |
| JP | 2001-051029 | 2/2001 |
| JP | 2001-057246 | 2/2001 |
| JP | 2001-231179 | 8/2001 |
| JP | 2002-243813 | 8/2002 |

OTHER PUBLICATIONS

Japanese Office Action dated Aug. 4, 2009 with partial translation.

* cited by examiner

*Primary Examiner* — Mohamed Charioui
*Assistant Examiner* — Elias Desta
(74) *Attorney, Agent, or Firm* — IPUSA, PLLC (57) ABSTRACT

A battery status detecting method for detecting a battery status of a secondary battery that supplies power to an electrical load is disclosed. This method includes measuring a discharge current value of the secondary battery, and estimating the dischargeable capacity or the dischargeable time of the secondary battery with the measured discharge current value based on discharge characteristics of the secondary battery indicating the discharge status of the secondary battery when the voltage of the secondary battery drops to a predetermined voltage specified by the electrical load.

12 Claims, 7 Drawing Sheets

APPARATUS AND METHOD FOR DETECTING A STATUS OF A SECONDARY BATTERY CONNECTED TO A LOAD

BACKGROUND OF THE INVENTION

1. Field of the Invention

The present invention relates to a battery status detecting method and a battery status detecting apparatus for detecting the status of a secondary battery that supplies power to an electrical load. The present invention also relates to a method of deriving an expression for calculating the dischargeable capacity of a secondary battery that supplies power to an electrical load.

2. Description of the Related Art

Open circuit voltage characteristics of a secondary battery indicating a relationship between the charge rate and the open circuit voltage of the secondary battery are conventionally assumed to be substantially constant regardless of degradation or changes in the usage conditions of the secondary battery. For example, Japanese Laid-Open Patent Publication No. 2001-231179 discloses a battery capacity detecting method using such open circuit voltage characteristics. Specifically, the disclosed battery capacity detecting method includes measuring the open circuit voltage during a rest period of a secondary battery and estimating the charge rate of the secondary battery at the time of the measurement based on the measured open circuit voltage and the open circuit voltage characteristics of the secondary battery obtained beforehand. It is noted that the above publication further discloses a method of estimating the full charge capacity of the secondary battery based on the charge rates of the secondary battery before and after performing battery charging operations and the amount of power charged to the secondary battery during the battery charging operations, and a method of estimating the remaining capacity of the secondary battery after completion of battery charging operations based on the charge rate after performing battery charging operations and the full charge capacity.

It is noted that various methods have been developed for estimating the remaining capacity of a secondary battery including the above-described method. However, operations of an electrical load receiving power supply from a secondary battery may be restricted by the voltage (power supply voltage) of the secondary battery rather than the remaining capacity of the secondary battery, and in this case, even when the secondary battery has adequate remaining capacity, an operation failure may still occur if the voltage of the secondary battery is below a required voltage for enabling operations of the electrical load. Because conventional methods do not take into consideration such characteristics of the electrical load that receives power from the secondary battery, the above-described risk of operation failure still exists even when the remaining capacity of the secondary battery is estimated.

SUMMARY OF THE INVENTION

An aspect of the present invention is directed to providing a battery status detecting method and a battery status detecting apparatus for accurately estimating a physical quantity such as the dischargeable capacity of a secondary battery that supplies power to an electrical load, the dischargeable capacity representing an amount of power that may be discharged until the voltage of the secondary battery drops to a predetermined voltage such as the minimum required voltage specified by the electrical load. Another aspect of the present invention is directed to providing a method of deriving an expression for calculating the dischargeable capacity of the secondary battery.

According to one embodiment of the present invention, a battery status detecting method is provided for detecting a battery status of a secondary battery that supplies power to an electrical load, the method including:

a current measuring step of measuring a discharge current value of the secondary battery; and an estimating step of estimating a dischargeable capacity or a dischargeable time of the secondary battery with the measured discharge current value based on discharge characteristics of the secondary battery indicating a discharge status of the secondary battery when a voltage of the secondary battery drops to a predetermined voltage specified by the electrical load.

According to another embodiment of the present invention, a battery status detecting apparatus is provided that detects a battery status of a secondary battery that supplies power to an electrical load, the apparatus including:

a storage unit that stores characteristics data used for determining secondary battery discharge characteristics indicating a discharge status of the secondary battery when a voltage of the secondary battery drops to a predetermined voltage specified by the electrical load; and an estimating unit that estimates a dischargeable capacity or a dischargeable time of the secondary battery using the characteristics data stored in the storage unit.

According to another embodiment of the present invention, an expression deriving method is provided for deriving a dischargeable capacity computing expression for computing a dischargeable capacity of a secondary battery that supplies power to an electrical load, the method including:

a measuring step of measuring first discharge characteristics indicating a relationship between a voltage and a discharge capacity of the secondary battery, the first discharge characteristics being measured with respect to a plurality of discharge current values of the secondary battery;

a converting step of converting the first discharge characteristics into second discharge characteristics indicating a relationship between the discharge capacity and the discharge current value of the secondary battery when the voltage of the secondary battery drops to a predetermined voltage specified by the electrical load; and an expression deriving step of deriving the dischargeable capacity computing expression based on the second discharge characteristics of the secondary battery.

DETAILED DESCRIPTION OF THE PREFERRED EMBODIMENTS

In the following, preferred embodiments of the present invention are described with reference to the accompanying drawings.

Figure 1:
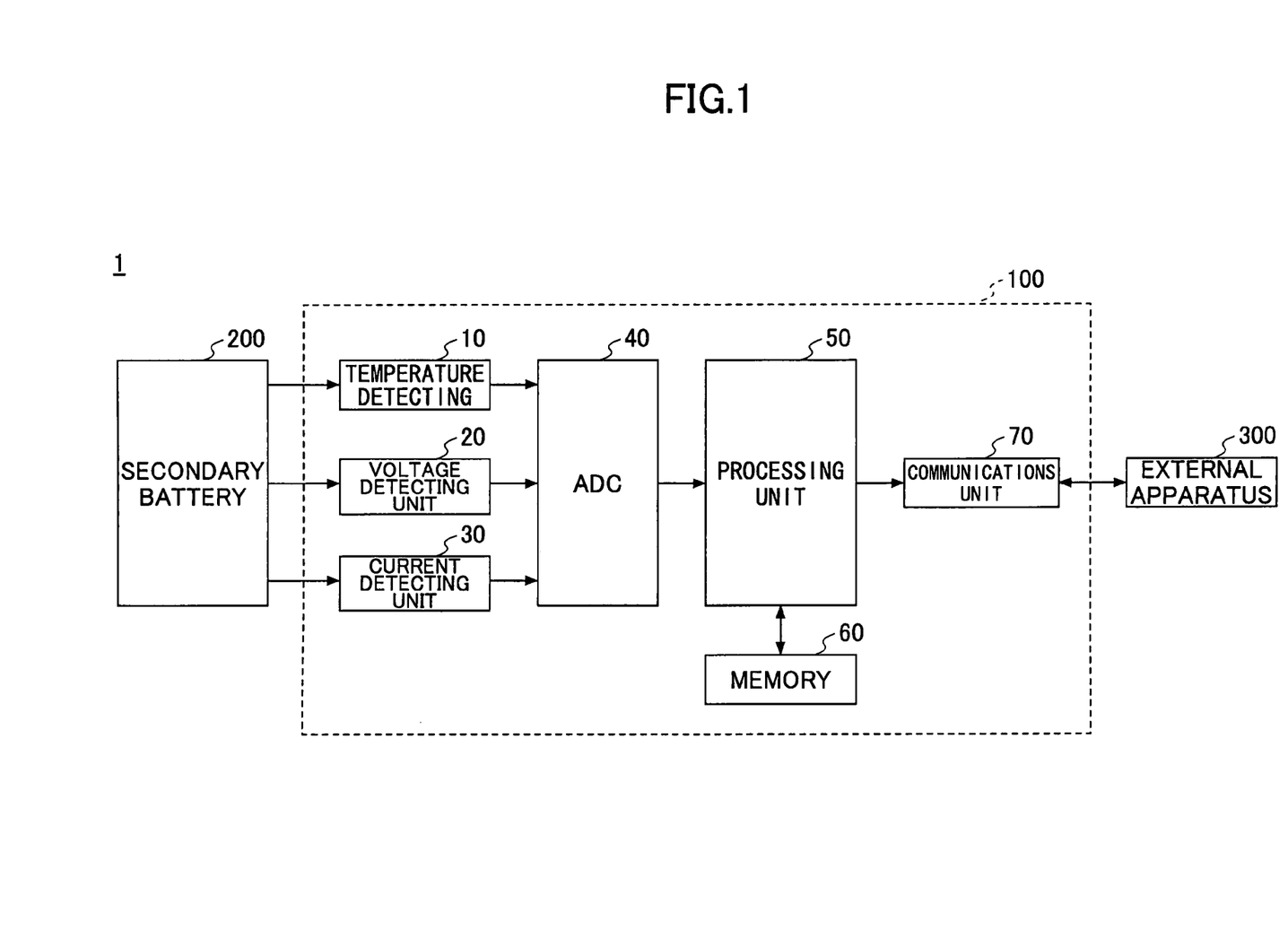
FIG. 1 is a block diagram showing a configuration of a system using a battery status detecting apparatus according to an embodiment of the present invention.

FIG. 1 is a block diagram showing a configuration of a system 1 that uses a battery status detecting apparatus 100 according to an embodiment of the present invention. The illustrated battery detecting apparatus 100 includes: a temperature detecting unit 10 that measures the temperature of a secondary battery 200, which may be a lithium ion battery, a nickel hydride battery, or an electric double layer capacitor, for example; a voltage detecting unit 20 that measures the voltage of the secondary battery 200; a current detecting unit 30 that measures the charging/discharging current of the secondary battery 200; an analog-to-digital converter (ADC) 40 that converts analog voltage values representing detection results output from the above detecting units into digital values; a processing unit 50 such as a microcomputer that performs computational processes such as current integration, capacity correction, or a dischargeable capacity calculation, for example; a memory 60 such as an electronically erasable programmable read only memory (EEPROM) or a flash memory that stores characteristics data for determining characteristics of the secondary battery 200 or the battery status detecting apparatus 100 that are used in executing the above processes; and a communications unit 70, such as a communications integrated circuit (IC) that transmits battery status information of the secondary battery 200 to an external apparatus 300 that uses the secondary battery 200 as a power source. It is noted that in one embodiment, the temperature detecting unit 10, the voltage detecting unit 20, the current detecting unit 30, the ADC 40, and the processing unit 50 may be packaged into an integrated circuit.

The temperature detecting unit 10 measures the temperature of the secondary battery 200, converts the measured temperature into a battery temperature indicating voltage that may be input to the ADC 40. The battery temperature indicating voltage is then converted by the ADC 40 into a battery temperature digital value indicating the temperature of the secondary battery 200, and the converted battery temperature digital value is conveyed to the processing unit 50 to be used as a parameter for computational processing. Also, the battery temperature digital value is converted into units pre-designated by the processing unit 50 and the converted battery temperature digital value is output to the external apparatus 300 via the communications unit 70 as battery status information indicating the battery status of the secondary battery 200. It is noted that the temperature of the secondary battery detected by the temperature detecting unit 10 may include the temperature of the secondary battery itself and the ambient temperature of the secondary battery. In a case where the secondary battery 200 and the battery status detecting apparatus 100 are located close to each other, the ambient temperature detected by the temperature detecting unit 10 may include the temperature of the battery status detecting apparatus 100 and its component units, for example. Also, in the case where the temperature detecting unit 10 is arranged within an integrated circuit package together with the voltage detecting unit 20, the current detecting unit 30, and the ADC 40, the temperature detecting unit 10 may detect the temperature of the integrated circuit itself or the ambient temperature thereof, for example.

The voltage detecting unit 20 measures the voltage of the secondary battery 200 and converts the measured battery voltage into a battery voltage indicating voltage that may be input to the ADC 40. The converted battery voltage indicating voltage is then converted by the ADC 40 into a battery voltage digital value indicating the voltage of the secondary battery 200, and the converted battery voltage digital value is conveyed to the processing unit 50 to be used as a parameter for computational processing. Also, the battery voltage digital value is converted into units pre-designated by the processing unit 50, and the converted battery voltage digital value is output to the external apparatus 300 via the communications unit 70 as battery status information indicating the battery status of the secondary battery 200.

The current detecting unit 30 measures the charging/discharging current of the secondary battery 200 and converts the measured charging/discharging current into a current indicating voltage that may be input to the ADC 40. Specifically, the current detecting unit 30 may include a current detecting resistor that is serially connected to the secondary battery 200 and an operational amplifier that amplifies voltages generated at two ends of the current detecting resistor. The measured charging/discharging current may be converted into the current indicating voltage by the current detecting resistor and the operational amplifier. It is noted that the operational amplifier may alternatively be provided at the ADC 40. The converted current indicating voltage is then output to be converted by the ADC 40 into a battery current digital value indicating the charging/discharging current of the secondary battery 200, and the converted battery current digital value is conveyed to the processing unit 50 to be used as a parameter for computational processing. Also, the battery voltage digital value is converted into units pre-designated by the processing unit 50, and the converted battery voltage digital value is output to the external apparatus 300 via the communications unit 70 as battery status information indicating the battery status of the secondary battery 200.

The processing unit 50 is capable of calculating the amount of electricity being charged to or discharged from the secondary battery 200 by performing integration on the current value detected by the current detecting unit 30 while the secondary battery 200 is being charged or discharged (e.g., a certain amount of current exceeding a predetermined value is being consumed by operations of the external apparatus 300). The processing unit 50 is also capable of calculating the amount of electricity currently stored in the secondary battery 200 (remaining capacity). It is noted that Japanese Laid-Open Patent Publication No. 2004-226393 discloses a concept relevant to calculation of the remaining capacity of a secondary battery. According to the disclosed concept, when the charging/discharging characteristics of a secondary battery change in response to changes in the charging/discharging conditions such as the temperature or the current of the secondary battery, the change is not regarded as a change in charging/discharging efficiency, but rather, a temporary change in the amount of electricity that cannot be charged/discharged. In other words, a certain amount of electricity that cannot be charged/discharged exists in the secondary battery, and this amount changes depending on the charging/discharging conditions. According to this concept, a correction process does not have to be performed with respect to the charging/discharging efficiency. However, when a temperature dependent circuit exists within the battery status detecting apparatus 100, the processing unit 50 may be configured to correct the charging/discharging current value of the secondary battery 200 that is digitally converted by the ADC 40 based on charging/discharging current-temperature characteristics and the temperature detected by the temperature detecting unit 10. It is noted that the charging/discharging current-temperature characteristics may be represented by a correction table or a correction function, for example. In this case, data included in the correction table or the coefficients of the correction function may be stored in the memory 60 as characteristics data. In turn, the processing unit 50 may correct the charging/discharging current value according to the temperature detected by the temperature detecting unit 10 based on the correction table or correction function representing the characteristics data read from the memory 60.

It is noted that a large number of errors may be included in the measurements made by the current detecting unit 30 or detection operations by the current detection unit 30 may be disabled for a certain period of time when charging/discharging operations of the secondary battery is at rest mode (e.g., when operations of the external apparatus 300 is at rest or in standby mode). In this case, if the above-described current integration process for calculating the remaining capacity is continued, errors may be integrated in the calculation as well so that the accuracy of the calculated remaining capacity may be degraded. In order to prevent such accuracy degradation, the processing unit 50 may be configured to stop the current value integration process, or the consumption current value of the external apparatus 300 may be detected beforehand and stored in the memory 60, for example.

However, even when the current value integration process is stopped during rest mode or a pre-detected consumption current value is used in the integration process, errors cannot be prevented from being included in the integration results obtained by the integration process because the actual consumption current value cannot be reflected in the integration process. Accordingly, in a preferred embodiment, when the external apparatus 300 remains in rest mode for over a predetermined time period, the processing unit 50 is configured to periodically detect the voltage (open circuit voltage) of the secondary battery 200 and calculate/correct the charge rate based on open circuit voltage-charge rate characteristics shown in FIG. 2.

Figure 2:
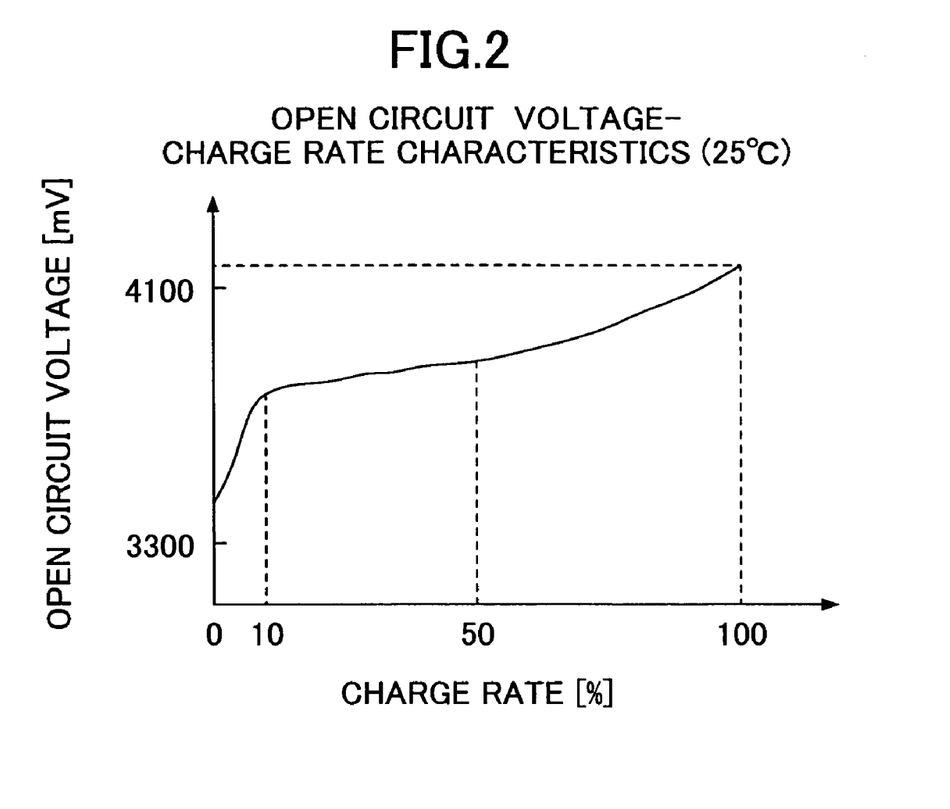
FIG. 2 is a graph showing open circuit voltage-charge rate characteristics of a secondary battery at 25° C.

It is noted that open circuit voltage refers to an interpolar voltage detected when the secondary battery 200 is stable and their terminals are open or maintain high impedance status (such a status including a low load status substantially equivalent to an open status). The charge rate is a value indicating the percentage of the remaining capacity of the secondary battery 200 with respect to the full charge capacity of the secondary battery 200. The open circuit voltage-charge rate characteristics are expressed by a correction table or a correction function, for example. In this case, data of the correction table or coefficients of the correction function may be stored in the memory 60 as characteristics data. The processing unit 50 refers to the correction table or correction function reflecting the characteristics data read from the memory 60 to calculate/correct the charge rate of the secondary battery 200 according to the open circuit voltage measured by the voltage detecting unit 20. It is noted that when the open circuit voltage of the secondary battery 200 has temperature characteristics, the processing unit 50 may be configured to perform predetermined temperature correction processes on the open circuit voltage measured by the voltage detecting unit 20.

As can be appreciated from the above descriptions, the processing unit 50 is capable of calculating the charge rate of the secondary battery. It is noted that because the remaining capacity of the secondary battery 200 is calculated based on the relationship between the full charge capacity and charge rate of the secondary battery 200, the remaining capacity of the secondary battery 200 cannot be calculated unless the full charge capacity of the secondary battery 200 is measured or estimated.

The full charge capacity of the secondary battery 200 may be calculated based on the amount of power discharged by the secondary battery 200 or the amount of power charged to the secondary battery 200, for example. In the case where a charging method other than pulse charging is used, the secondary battery 200 is charged with a constant voltage or a constant current so that the charge current may be more accurately measured. Thus, a calculation based on the amount of charged power may be preferably used in such a case instead of a calculation based on the amount of discharged power, which is prone to be influenced by the current consumption characteristics of the external apparatus 300. However, the method for calculating the full charge capacity of the secondary battery 200 is not limited to a particular method and one or both of the above methods may be suitably selected for use, depending on the characteristics of the external apparatus 300.

In order to obtain an accurate measurement of the full charge capacity of a battery, the battery has to be continually charged from the time the power capacity of the battery is zero until the battery is fully charged. Specifically, the amount of charging current accumulated during this charging period corresponds to the full charge capacity. However, it is noted that under normal circumstances, a battery is rarely charged in the manner described above. That is, a battery is usually charged while it still has a certain amount of energy remaining.

Accordingly, in the present embodiment, the processing unit 50 is configured to calculate the full charge capacity of the secondary battery 200 based on the battery voltage right before starting charging operations and the battery voltage after a predetermined time elapses from the time charging operations of the secondary battery 200 are ended. Specifically, the processing unit 50 calculates the charge rate of the secondary battery 200 right before charging operations are started based on the open circuit voltage of the secondary battery 200 right before the charging operations are started and the open circuit voltage-charge rate characteristics of the secondary battery 200 shown in FIG. 2. Additionally, the processing unit 50 calculates the charge rate of the secondary battery 200 after a predetermined time elapses from the end of the charging operations based on the open circuit voltage of the secondary battery 200 after the predetermined time elapses from the end of the charging operations and the open circuit voltage-charge rate characteristics of the secondary battery 200 shown in FIG. 2. Provided that the full charge capacity of the secondary battery 200 is denoted by FCC [mAh], the charge rate right before the charging operations are started is denoted by SOC1 [%], the charge rate after the predetermined time elapses from the end of the charging operations is denoted by SOC2 [%], and the amount of electricity charged during the charge period from the start to the end of the charging operations is denoted by Q [mah], the processing unit 50 calculates the full charge capacity FCC of the secondary battery 200 based on the following expression (1):

$$FCC = Q/\{(SOC2 - SOC1)/100\} \quad (1)$$

In one preferred embodiment, the values of SOC1 and SOC2 may be temperature-corrected in order to perform a more accurate calculation. Also, it is noted that the battery voltage after a predetermined time elapses from the end time of the charging operations is preferably used as the value of SOC2 as opposed to the battery voltage right after the charging operations, because the battery voltage may be more stabilized after the predetermined time elapses and such stabilized battery voltage may be reflected in the calculation to obtain a more accurate calculation result.

According to the present embodiment, the remaining capacity of the secondary battery 200 may be calculated based on the charge rate and the full charge capacity of the secondary battery 200 calculated in the above-described manner (i.e., remaining capacity=full charge capacity× charge rate).

It is noted that by enabling calculation of the full charge capacity FCC of the secondary battery 200, the degree of degradation SOH [%] of the secondary battery 200 may be estimated. Specifically, provided that the initial full charge capacity of the secondary battery 200 is denoted by AFCC, and the full charge capacity of the secondary battery 200 at a given point in time is denoted by RFCC, the processing unit 50 may calculate the degree of degradation SOH at a given point in time based on the following expression (2):

$$SOH = RFCC/AFCC \times 100 \quad (2)$$

However, even when the secondary battery 200 has energy remaining therein, not all the energy remaining in the secondary battery 200 may be used as dischargeable energy. That is, operations of the external apparatus 300 receiving power from the secondary battery 200 may be restricted or disabled when the battery voltage of the secondary battery 200 is less than the minimum operation voltage required for operating the external apparatus 300 (apparatus shutdown voltage). Such an effect occurs owing to the fact that the dischargeable capacity of the secondary battery 200 varies depending on its temperature, and the battery voltage of the secondary battery 200 varies depending on its discharge rate.

An aspect of the present invention is directed to preventing operations of the external apparatus 300 from being restricted owing to the battery voltage of the secondary battery 200 becoming lower than the apparatus shutdown voltage of the external apparatus 300 by accurately calculating the remaining time during which the external apparatus 300 may continue to operate. According to an embodiment of the present invention, the processing unit 50 is configured to calculate the dischargeable capacity of the secondary battery 200 according to the apparatus shutdown voltage of the external apparatus 300 and the temperature and discharge rate of the secondary battery 200 using an expression (i.e., dischargeable capacity computing expression) for calculating the dischargeable capacity of the secondary battery 200.

In the following, a method of deriving the dischargeable capacity computing expression is described.

Figure 3:
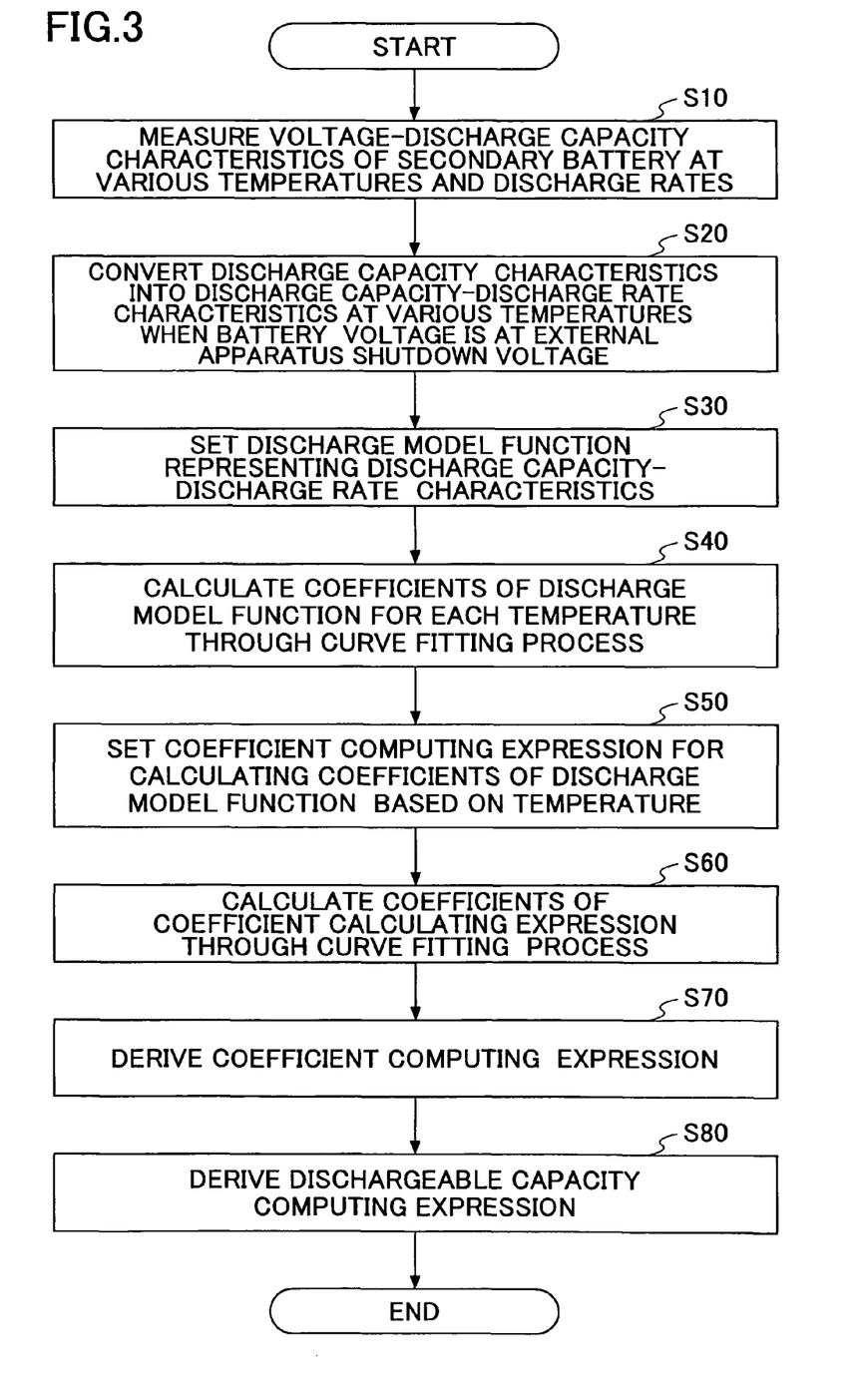
FIG. 3 is a flowchart showing process steps for deriving a dischargeable capacity computing expression according to an embodiment of the present invention.

FIG. 3 is a flowchart showing process steps of a dischargeable capacity computing expression deriving process according to an embodiment of the present invention.

In the illustrated process, first, voltage-discharge capacity characteristics of the secondary battery 200 (referred to as 'discharge capacity characteristics' hereinafter) are actually measured at varying temperatures and discharge rates (step S10). Specifically, because the discharge capacity of the secondary battery 200 to be calculated in the present process is determined based on the apparatus shutdown voltage of the external apparatus 300 and the temperature and discharge rate of the secondary battery 200, in step S10, discharge capacity characteristics of the secondary battery 200 at varying temperatures and discharge rates are determined beforehand.

Figure 4A:
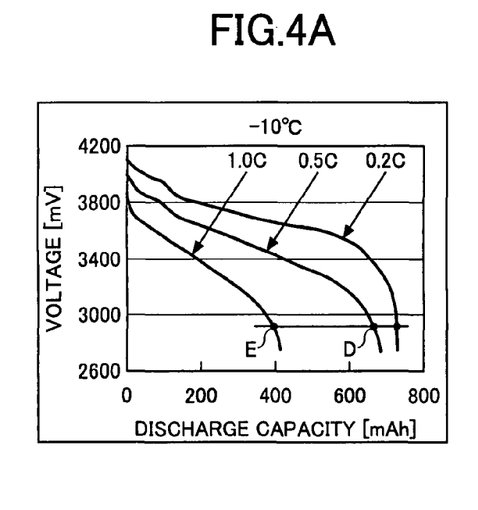
FIGS. 4A-4C are graphs showing discharge capacity characteristics of the secondary battery.
Figure 4B:
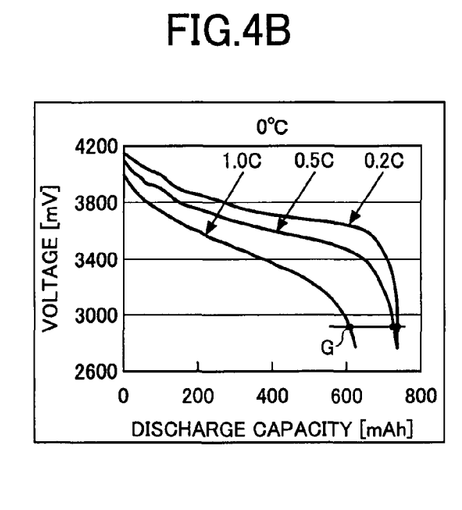
Figure 4C:
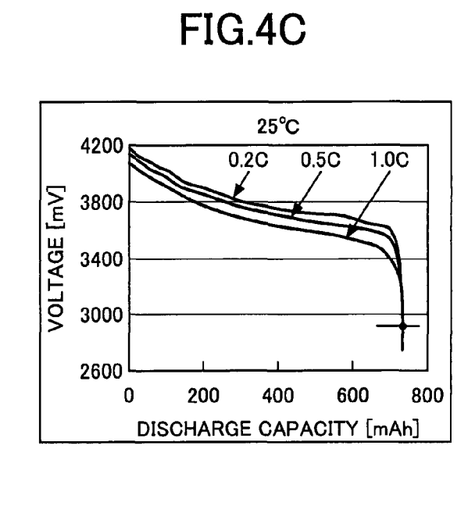

FIGS. 4A-4C are graphs showing discharge capacity characteristics of the secondary battery 200, the horizontal axis representing the discharge capacity and the vertical axis representing the battery voltage of the secondary battery 200. Specifically, FIG. 4A shows discharge capacity characteristics of the secondary battery 200 at −10° C.; FIG. 4B shows discharge capacity characteristics of the secondary battery 200 at 0° C.; and FIG. 4C shows discharge capacity characteristics of the secondary battery 200 at 25° C. It is noted that the actual measurements of the discharge capacity characteristics shown in FIGS. 4A-4C represent transitions in the battery voltage in relation to transitions in the discharge capacity (amount of power discharged) with respect to the full charge capacity when the secondary battery 200 discharges power at varying discharge rates (i.e., 1.0 C, 0.5 C, and 0.2 C). Also, it is noted that the discharge rate represents a discharge current value expressed as a fraction of the rated capacity C of the secondary battery 200.

After discharge capacity characteristics of the secondary battery 200 are measured, the measured discharge capacity characteristics are converted into discharge capacity-discharge rate characteristics (referred to as 'discharge rate characteristics' hereinafter) at various temperatures when the battery voltage is at the apparatus shutdown voltage of the external apparatus 300 (step S20).

Figure 5:
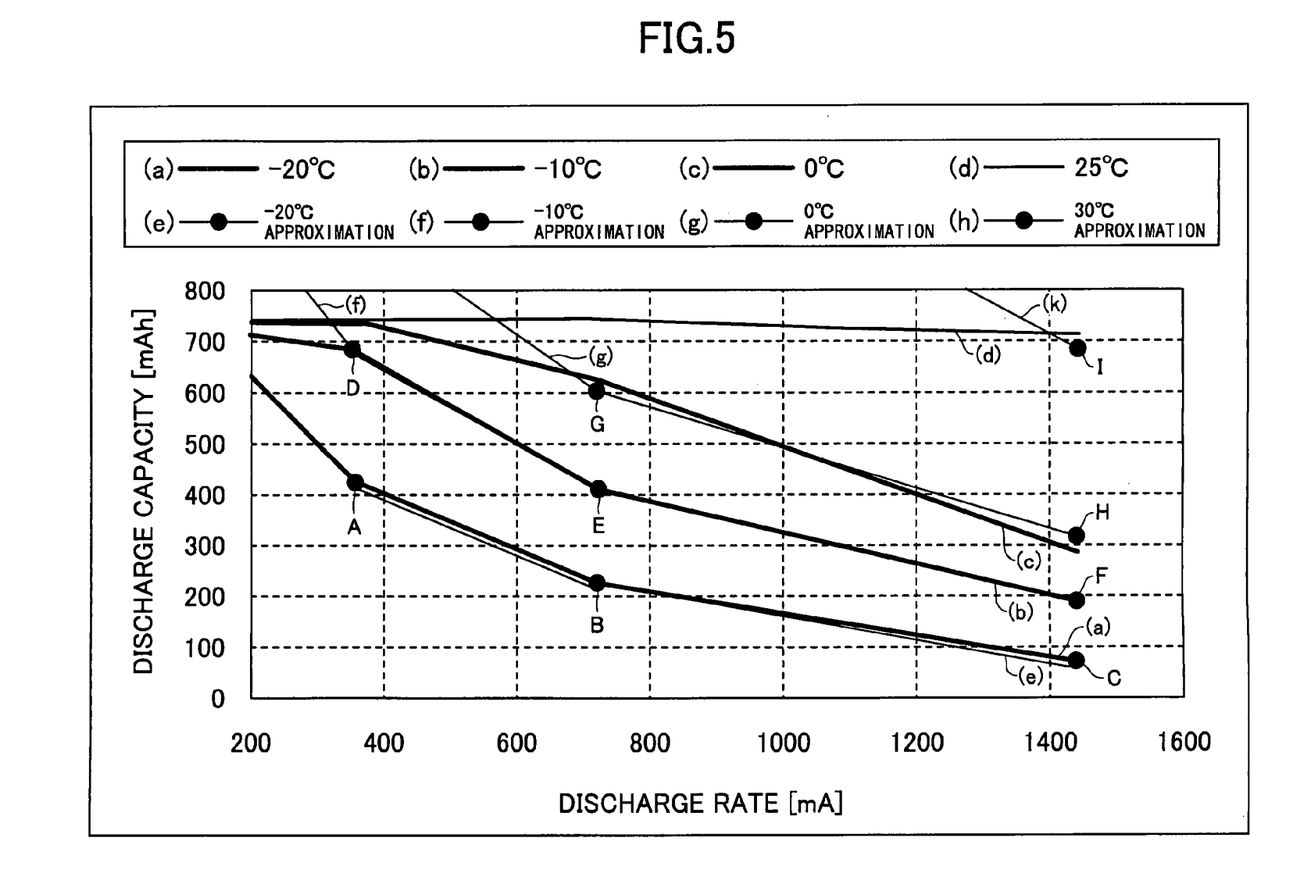
FIG. 5 is a graph showing discharge rate characteristics of the secondary battery when the battery voltage is at an external apparatus shutdown voltage of 2.75 V.

FIG. 5 is a graph representing discharge rate characteristics of the secondary battery 200 in a case where the apparatus shutdown voltage of the external apparatus 300 is 2.75 V. Specifically, the graph of FIG. 5 representing the discharge rate characteristics shows the relationship between the discharge capacity and the discharge rate of the secondary battery 200 when the battery voltage is at 2.75 V, according to the discharge capacity characteristics shown in FIGS. 4A-4C. In other words, the discharge rate characteristics of the secondary battery 200 shown in FIG. 5 are equivalent conversions of the discharge capacity characteristics shown in FIGS. 4A-4C that represent transitions in the discharge capacity of the secondary battery 200 at the time the battery voltage drops to the apparatus shutdown voltage upon discharging power from the secondary battery 200 at various discharge rates. Although the upper portions of the graph shown in FIG. 5 are leveled off, it can be expected that the plotted curves indicating the discharge rate characteristics at various temperatures may each be expressed by a polynomial function with the temperature as a variable. Accordingly, a discharge model function for representing the discharge rate characteristics of the secondary battery 200 at each temperature is estimated based on the profile of the graph of FIG. 5 (step S30).

Specifically, in the present embodiment, based on the profile of the graph shown in FIG. 5, the discharge model function is represented by an expression (3) including a natural logarithm ln(I) as is indicated below:

$$Q = A \cdot I + B \cdot \ln(I) + C - (FCC - \text{remaining capacity}) \quad (3)$$

It is noted that in the above expression (3), Q denotes the discharge capacity of the secondary battery 200, I denotes the discharge rate (discharge current value) of the secondary battery 200, and A, B, and C represent coefficients. By calculating the values of the coefficients A, B, and C, the graph of FIG. 5 representing the discharge rate characteristics of the secondary battery 200 at a given temperature may be uniquely defined by the expression (3).

In the present embodiment, curve fitting is employed to calculate the values of the coefficients A, B, and C of the discharge model function (3) for each temperature (step S40). Specifically, the values of the coefficients A, B, and C of the discharge model function (3) representing the illustrated discharge rate characteristics at each temperature shown in FIG. 5 are calculated (i.e., coefficient values of A, B, C are calculated for the expression (3) representing discharge rate characteristics at −20° C., the expression (3) representing discharge rate characteristics at −10° C., and so on).

It is noted that curve fitting refers to a mathematical method for obtaining a curve (regression curve) that fits a set of data values. According to this method, a model function is provided beforehand, and parameters determining the profile of the model function are statistically estimated. For example, the method of least squares may be implemented in the curve fitting process. To calculate the coefficients of the expression (3) through curve fitting, numerical analysis software such as MATLAB or LabVIEW may be used.

Then, coefficient computing expressions for calculating the values of the coefficients A, B, and C of the expression (3) based on the temperature are obtained (step S50). Specifically, the coefficients A, B, and C are represented as functions of the temperature so that the plural curves representing discharge rate characteristics (expression (3)) at various temperatures shown in FIG. 5 may be represented by a single approximate expression. In the present embodiment, the coefficient computing expressions for the coefficients A, B, and C are each represented by a quadratic function (4) indicating coefficient-temperature characteristics with the temperature T as a variable as is shown below:

$$\text{Coefficient} = a \cdot T^2 + b \cdot T + c \quad (4)$$

Specifically, the coefficient computing expressions for the coefficients A, B, and C are represented by the following expressions (4a), (4b), and (4c), respectively:

$$A = A(T) = a1 \cdot T^2 + b1 \cdot T + c1 \quad (4a)$$

$$B = B(T) = a2 \cdot T^2 + b2 \cdot T + c2 \quad (4b)$$

$$C = C(T) = a3 \cdot T^2 + b3 \cdot T + c3 \quad (4c)$$

Figure 6A:
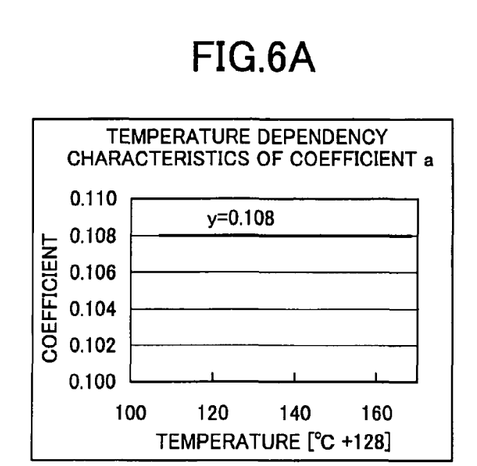
FIGS. 6A-6C are graphs showing temperature dependency characteristics of coefficients of coefficient computing expressions that are obtained through curve fitting processes.
Figure 6B:
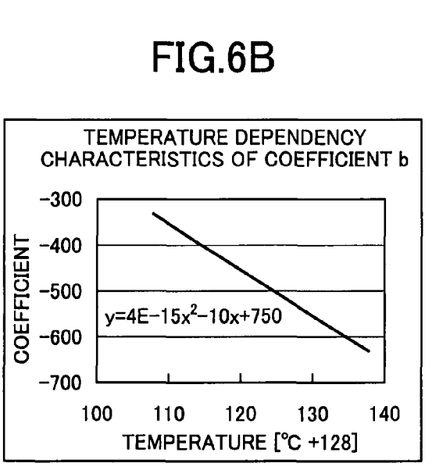
Figure 6C:
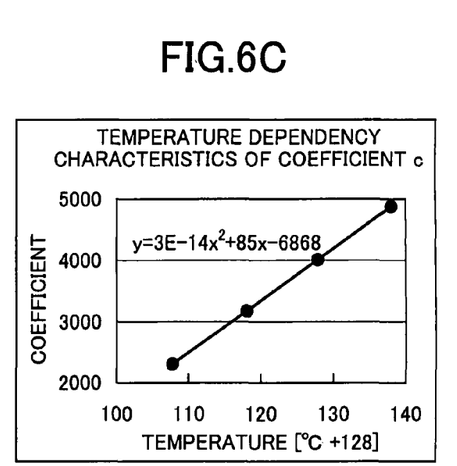

Then, the curve fitting process described above is applied to the values of the coefficients A, B, and C at various temperatures calculated in step S40 (i.e., sets of data describing the coefficient values calculated in step S40 and their corresponding temperatures) to calculate the coefficients {a1, b1, c1}, {a2, b2, b3}, and {a3, b3, c3} of the coefficient computing expressions (4a), (4b), and (4c), respectively (step S60). FIGS. 6A-6C are graphs representing temperature dependency characteristics (coefficient-temperature characteristics) of the coefficients a, b, and c of the expression (4) that are obtained through the above-described curve fitting operations.

Then, the coefficient values calculated in step S60 are substituted into the expressions (4a), (4b), and (4c) so that coefficient computing expressions for calculating the coefficients A, B, and C may be derived (step S70). Then, the coefficient computing expressions derived in step S70 are substituted into the above expression (3) so that a dischargeable capacity computing expression with the temperature T and the current value I as variables may be derived (step S80).

In the following, a calculating process performed by the processing unit 50 for calculating the dischargeable capacity based on the dischargeable capacity computing expression derived in step S80 is described.

Figure 7:
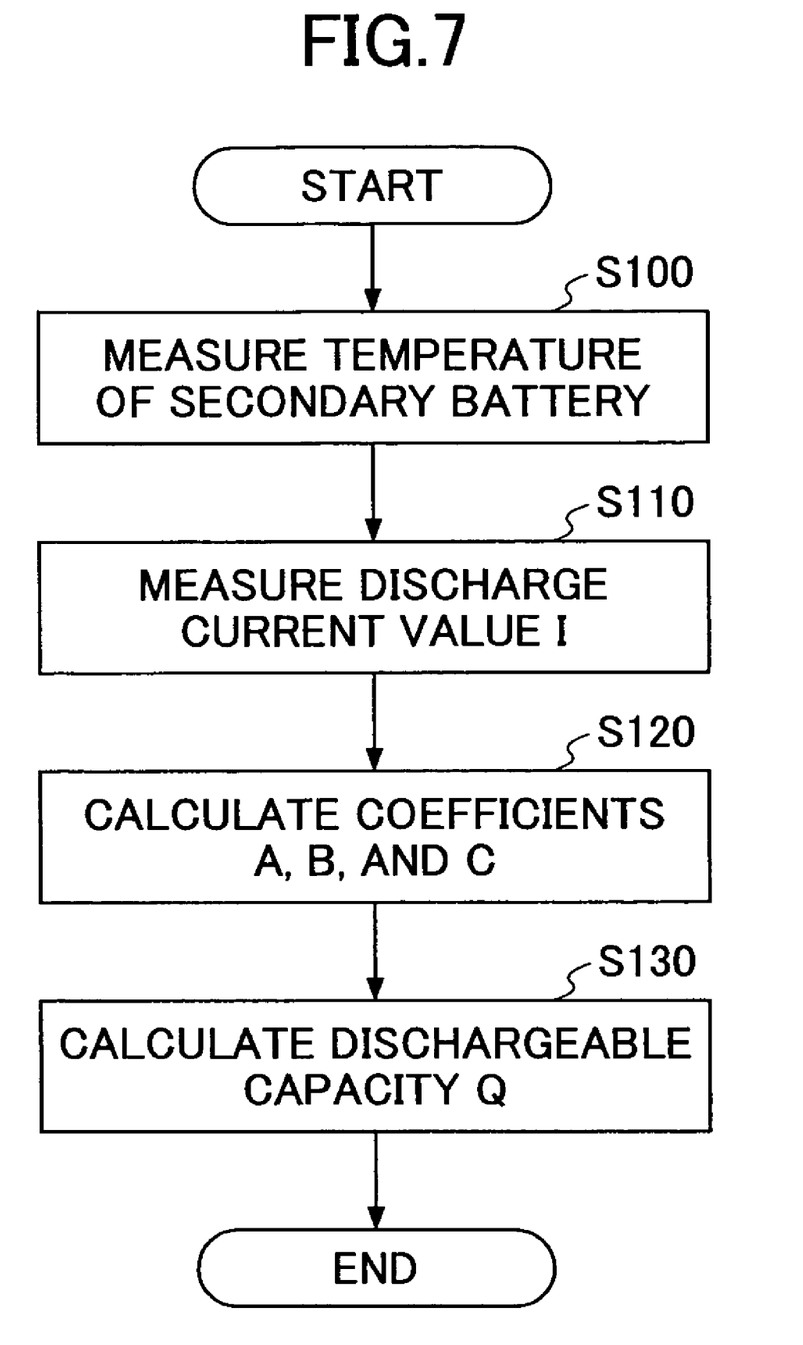
FIG. 7 is a flowchart showing process steps for calculating a dischargeable capacity of the secondary battery.

FIG. 7 is a flowchart illustrating exemplary process steps of such a dischargeable capacity calculating process.

According to the illustrated example, first, the processing unit 50 acquires the temperature of the secondary battery 200 that is measured by the temperature detecting unit 10 via the ADC 40 (step S100). Also, the processing unit 50 acquires the current value I of the discharge current of the secondary battery 200 that is measured by the current detecting unit 30 via the ADC 40 (step S110). Then, the processing unit 50 substitutes the temperature T acquired in step S100 into the coefficient computing expressions (4a), (4b), and (4c) to calculate the coefficients A, B, and C (step S120). It is noted that the coefficients {a1, b1, c1}, {a2, b2, b3}, and {a3, b3, c3} of the coefficient computing expressions (4a), (4b), and (4c) are calculated beforehand in the manner described above and stored in the memory 60. Accordingly, in step S120, the processing unit 50 calculates the values of the coefficients A, B, and C at temperature T based on the values of the coefficients {a1, b1, c1}, {a2, b2, b3}, and {a3, b3, c3} read from the memory 60 and the value of the temperature T. Then, the processing unit 50 substitutes the current value I acquired in step S110 and the values of the coefficients A, B, and C calculated in step S120 into the dischargeable capacity computing expression (3) derived in step S80 of FIG. 3 to calculate the dischargeable capacity Q of the secondary battery 200 indicating the amount of power that may be discharged until the battery voltage drops to the apparatus shutdown voltage of the external apparatus 300 (step S130). By calculating the dischargeable capacity Q, the processing unit 50 may be able to calculate the dischargeable time of the secondary battery 200 until the battery voltage drops to the apparatus shutdown voltage by dividing the calculated dischargeable capacity Q by the current value I measured by the current detecting unit 30.

In the above-described embodiment of the present invention, the processing unit 50 may be able to accurately estimate the dischargeable capacity and the dischargeable time of the secondary battery 200 until the battery voltage drops to a predetermined voltage specified by the electrical load receiving power from the secondary battery 200 (i.e., the apparatus shutdown voltage of the external apparatus 300). In one preferred embodiment, the processing unit 50 may inform the external apparatus 300 of the calculated dischargeable capacity and/or the dischargeable time via the communications unit 70 so that the external apparatus 300 may be aware of the remaining capacity and/or the remaining discharge time of the secondary battery 200.

Also, in the above-described embodiment of the present invention, data used for determining the discharge characteristics of the secondary battery 200 (i.e., the coefficients {a1, b1, c1}, {a2, b2, b3}, and {a3, b3, c3} of the coefficient computing expressions (4a), (4b), and (4c)) are stored in the memory 60, and the dischargeable capacity of the secondary battery 200 is calculated based on the data read from the memory 60 and the expression (3).

By implementing such measures, the dischargeable capacity of the secondary battery 200 may be more accurately calculated using a smaller memory area compared to a case in which the dischargeable capacity is calculated based on characteristics data stored in a lookup table indicating temperature-current characteristics of the secondary battery 200, for example. Also, costs of the IC and other component elements may be reduced by using a smaller memory area. Further, in a preferred embodiment, characteristics data stored in the memory 60 may be rewritten according to current characteristics of the secondary battery 200 so that the dischargeable capacity of a secondary battery with varying characteristics may be calculated.

Also, in the above-described embodiment of the present invention, the dischargeable capacity of the secondary battery 200 may be calculated/estimated based on a discharge current value specified by the external apparatus 300, for example, rather than the discharge current value measured at the time of the dischargeable capacity calculation/estimation. In this way, it may be known beforehand whether desired operations of the external apparatus 300 may be performed. Also, in alternative embodiments, similar calculations/estimations may be performed by designating the battery voltage or the temperature instead of the discharge current value, for example.

Further, although the present invention is described above with respect to certain preferred embodiments, the present invention is not limited to these specific embodiments and variations and modifications may be made without departing from the scope of the present invention.

For example, based on the profile of the graph shown in FIG. 5, the discharge model function may be represented by an expression (5) including an inverse term (1/I) as is indicated below:

$$Q=A'\cdot I+B'\cdot(1/I)+C'-(FCC-\text{remaining capacity}) \quad (5)$$

Even when the discharge model function is represented by the expression (5) instead of the expression (3) described above, discharge rate characteristics of FIG. 5 may still be uniquely defined by the expression (5) provided that the values of the coefficients A', B', and C' may be calculated in a similar manner as the coefficients A, B, and C described above.

Also, although the apparatus shutdown voltage is used as the predetermined voltage specified by the electrical load in the above-described embodiment, the present invention is not limited to such an embodiment and may be applied to calculate the dischargeable capacity or dischargeable time of a secondary battery until the battery voltage drops to any given voltage.

The present application is based on and claims the benefit of the earlier filing date of Japanese Patent Application No. 2007-197862 filed on Jul. 30, 2007, the entire contents of which are incorporated by reference.

What is claimed is:

1. A battery status detecting method performed by a battery status detecting apparatus that is connected to a secondary battery to detect a battery status of the secondary battery that supplies power to an electrical load, the method comprising:
a current measuring step of measuring a discharge current value of the secondary battery; and
an estimating step of the battery status detecting apparatus estimating a dischargeable capacity or a dischargeable time of the secondary battery that is defined as a capacity or time dischargeable with the measured discharge current value before a voltage of the secondary battery drops to a predetermined voltage specified by the electrical load, the estimating being performed based on discharge characteristics of the secondary battery, the discharge characteristics indicating relationships between a discharge capacity and a discharge rate that are observed when the voltage of the secondary battery drops to the predetermined voltage specified by the electrical load,
wherein the discharge characteristics indicate a relationship between a discharge capacity and the discharge current value of the secondary battery,
and wherein
the discharge characteristics are represented by an expression described as:

$$Q=A\cdot I+B\cdot \ln(I)+C-(FCC-\text{remaining capacity})$$

or $$Q=A'\cdot I+B'\cdot(1/I)+C'-(FCC-\text{remaining capacity})$$

where Q represents the dischargeable capacity of the secondary battery, I represents the discharge current value of the secondary battery, FCC represents a full charge capacity of the secondary battery, A, B, and C represent coefficients of the expression, and A', B', and C' represent coefficients of the expression.

2. The battery status detecting method as claimed in claim 1, wherein
values of the coefficients A, B, and C of the expression vary according to a temperature of the secondary battery.

3. The battery status detecting method as claimed in claim 1, wherein
values of the coefficients A', B', and C' of the expression vary according to a temperature of the secondary battery.

4. A battery status detecting apparatus that detects a battery status of a secondary battery that supplies power to an electrical load, the apparatus comprising:
a storage unit that stores characteristics data used for determining secondary battery discharge characteristics, the characteristics data indicating relationships between a discharge capacity and a discharge rate that are observed when a voltage of the secondary battery drops to a predetermined voltage specified by the electrical load; and
an estimating unit that estimates a dischargeable capacity or a dischargeable time of the secondary battery that is defined as a capacity or time dischargeable before the voltage of the secondary battery drops to the predetermined voltage specified by the electrical load, the estimating being pet-formed using the characteristics data stored in the storage unit,
wherein the discharge characteristics indicate a relationship between a discharge capacity and a discharge current value of the secondary battery,
and wherein
the discharge characteristics are represented by an expression described as:

$$Q=A\cdot I+B\cdot \ln(I)+C-(FCC-\text{remaining capacity})$$

or $$Q=A'\cdot I+B'\cdot(1/I)+C'-(FCC-\text{remaining capacity})$$

where Q represents the dischargeable capacity of the secondary battery, I represents the discharge current value of the secondary battery, FCC represents a full charge capacity of the secondary battery, A, B, and C represent coefficients of the expression, and A', B', and C' represent coefficients of the expression; and
the characteristics data include data for determining values of the coefficients A, B, and C or data for determining values of the coefficients A', B', and C'.

5. The battery status detecting apparatus as claimed in claim 4, wherein
the values of the coefficients A, B, and C of the expression vary according to a temperature of the secondary battery.

6. The battery status detecting apparatus as claimed in claim 4, wherein
the values of the coefficients A', B', and C' of the expression vary according to a temperature of the secondary battery.

7. An expression deriving method for deriving a dischargeable capacity computing expression for computing a dischargeable capacity of a secondary battery that supplies power to an electrical load, the method comprising:
a measuring step of measuring first discharge characteristics indicating a relationship between a voltage and a discharge capacity of the secondary battery, the first discharge characteristics being measured with respect to a plurality of discharge current values of the secondary battery;
a converting step of converting the first discharge characteristics into second discharge characteristics indicating a relationship between the discharge capacity and the discharge current value of the secondary battery when the voltage of the secondary battery drops to a predetermined voltage specified by the electrical load;

an expression deriving step of deriving the dischargeable capacity computing expression based on the second discharge characteristics of the secondary battery;

storing data indicative of the derived dischargeable capacity computing expression in a memory of a battery status detecting apparatus that detects a battery status of the secondary battery; and configuring the battery status detecting apparatus such that the battery status detecting apparatus detects the battery status of the secondary battery based on the dischargeable capacity computing expression stored in the memory.

8. The expression deriving method as claimed in claim 7, wherein the expression deriving step includes approximating the second discharge characteristics of the secondary battery as a discharge model function corresponding to the dischargeable capacity computing expression and determining a value of a coefficient of the discharge model function.

9. The expression deriving method as claimed in claim 8, wherein the measuring step includes measuring the first discharge characteristics of the secondary battery with respect to a plurality of temperatures of the secondary battery;

the converting step includes converting the first discharge characteristics into the second discharge characteristics with respect to each of the temperatures; and the expression deriving step includes determining the value of the coefficient of the discharge model function with respect to each of the temperatures, determining a correlation between the temperatures and the value of the coefficient determined with respect to each of the temperatures, and deriving a coefficient computing expression for computing a corresponding value of the coefficient of the discharge model function for a given temperature based on the determined correlation.

10. The expression deriving method as claimed in claim 8, wherein the discharge model function is expressed as:

$$Q = A \cdot I + B \cdot \ln(I) + C - (FCC - \text{remaining capacity})$$

where Q represents the dischargeable capacity of the secondary battery, I represents the discharge current value of the secondary battery, FCC represents a full charge capacity of the secondary battery, and A, B, and C each represent the coefficient of the discharge model function.

11. The expression deriving method as claimed in claim 8, wherein the discharge model function is expressed as:

$$Q = A' \cdot I + B' \cdot (1/I) + C' - (FCC - \text{remaining capacity})$$

where Q represents the dischargeable capacity of the secondary battery, I represents the discharge current value of the secondary battery, FCC represents a full charge capacity of the secondary battery, and A', B', and C' each represent the coefficient of the discharge model function.

12. The expression deriving method as claimed in claim 7, wherein the measuring step includes measuring the first discharge characteristics of the secondary battery with respect to a plurality of temperatures of the secondary battery; and the converting step includes converting the first discharge characteristics into the second discharge characteristics with respect to each of the temperatures.

* * * * *